United States Patent
Choi et al.

(10) Patent No.: US 12,378,448 B2
(45) Date of Patent: Aug. 5, 2025

(54) NON-CONDUCTIVE ADHESIVE FILM FOR SEMICONDUCTOR PACKAGE AND SEMICONDUCTOR PACKAGE MANUFACTURING METHOD USING SAME

(71) Applicant: DOOSAN CORPORATION, Seoul (KR)

(72) Inventors: Taejin Choi, Yongin-si (KR); Woojeong Kim, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 821 days.

(21) Appl. No.: 17/418,445

(22) PCT Filed: Aug. 23, 2019

(86) PCT No.: PCT/KR2019/010782
§ 371 (c)(1),
(2) Date: Jun. 25, 2021

(87) PCT Pub. No.: WO2020/138632
PCT Pub. Date: Jul. 2, 2020

(65) Prior Publication Data
US 2022/0017794 A1  Jan. 20, 2022

(30) Foreign Application Priority Data
Dec. 27, 2018  (KR) .......... 10-2018-0170634

(51) Int. Cl.
*C09J 163/00* (2006.01)
*C09J 11/04* (2006.01)
(Continued)

(52) U.S. Cl.
CPC .......... *C09J 163/00* (2013.01); *C09J 11/04* (2013.01); *C09J 11/06* (2013.01); *H01L 24/83* (2013.01);
(Continued)

(58) Field of Classification Search
CPC .......... C08G 59/4215; C08G 59/686; C08G 59/245; C09J 7/30; C09J 7/20;
(Continued)

(56) References Cited

U.S. PATENT DOCUMENTS

2016/0340558 A1* 11/2016 Oda .......... C09J 7/20

FOREIGN PATENT DOCUMENTS

| CN | 102222633 A | 10/2011 |
| CN | 105555848 A | 5/2016 |

(Continued)

OTHER PUBLICATIONS

Machine translation of JP 2014-55245 date unknown.*
(Continued)

*Primary Examiner* — John L Goff, II
(74) *Attorney, Agent, or Firm* — Sughrue Mion, PLLC

(57) ABSTRACT

A non-conductive adhesive film for semiconductor packages and a method of manufacturing a semiconductor package using the non-conductive adhesive film are disclosed. The non-conductive adhesive film for semiconductor packages includes a base; and an adhesive layer disposed on one surface of the base and having a storage modulus in a range of 2 to 4 GPa at 25° C.

18 Claims, 5 Drawing Sheets

(51) Int. Cl.
*C09J 11/06* (2006.01)
*H01L 23/00* (2006.01)
*C08K 3/36* (2006.01)
*C08K 5/3412* (2006.01)
*C08K 5/3432* (2006.01)
*C08K 5/3462* (2006.01)

(52) U.S. Cl.
CPC ............. *C08K 3/36* (2013.01); *C08K 5/3412* (2013.01); *C08K 5/3432* (2013.01); *C08K 5/3462* (2013.01); *C08K 2201/003* (2013.01); *C08K 2201/011* (2013.01); *C09J 2203/326* (2013.01); *C09J 2301/312* (2020.08); *C09J 2301/408* (2020.08); *H01L 2224/83203* (2013.01)

(58) Field of Classification Search
CPC . C09J 11/04; C09J 11/06; C09J 163/00; C09J 2203/326; C09J 2301/312; C09J 2301/408; C09J 2463/00; H01L 21/56; H01L 23/00; H01L 23/48; H01L 23/482; H01L 23/481; H01L 23/4828; H01L 24/26; H01L 24/83; H01L 2224/83203; H01L 2224/16145; H01L 2224/16146; H01L 2224/73204; H01L 2224/81; H01L 2224/83191; C08K 3/36; C08K 5/3412; C08K 5/3432; C08K 5/3462; C08K 2201/003; C08K 2201/011
See application file for complete search history.

(56) References Cited

FOREIGN PATENT DOCUMENTS

| | | | |
|---|---|---|---|
| JP | 2006-335843 A | 12/2006 | |
| JP | 2007-294681 A | 11/2007 | |
| JP | 2011-228399 A | 11/2011 | |
| JP | 2012-502166 A | 1/2012 | |
| JP | 2013-219286 A | 10/2013 | |
| JP | 2014-55245 A | 3/2014 | |
| JP | 2014-204084 A | 10/2014 | |
| JP | 2014-210880 A | 11/2014 | |
| JP | 2015-86359 A | 5/2015 | |
| JP | 2015-233150 A | 12/2015 | |
| JP | 2016-76722 A | 5/2016 | |
| KR | 10-2016-0039063 A | 4/2016 | |
| KR | 10-2016-0060073 A | 5/2016 | |
| KR | 10-1920091 B1 | 11/2018 | |
| WO | 03/042311 A1 | 5/2003 | |
| WO | WO-2015045846 A1 * | 4/2015 | ......... C08G 59/5073 |
| WO | 2015/083587 A1 | 6/2015 | |

OTHER PUBLICATIONS

Machine translation of JP 2006-335843 date unknown.*
Machine translation of JP 2012-502166 date unknown.*
Machine translation of JP 2014-204084 date unknown.*
Machine translation of WO 2015/083587 date unknown.*
International Searching Authority, Written opinion for PCT/KR2019/010782 dated Dec. 10, 2019.
International Searching Authority, International Search report for PCT/KR2019/010782 dated Dec. 10, 2019.
Office Action dated Sep. 2, 2022 in Chinese Application No. 201980085552.8.
"Epoxy Resin Adhesives", 1st edition, edited by He Manluo, Sinopec Press, 2004, pp. 112-113 (4 pages).

* cited by examiner

NON-CONDUCTIVE ADHESIVE FILM FOR SEMICONDUCTOR PACKAGE AND SEMICONDUCTOR PACKAGE MANUFACTURING METHOD USING SAME

CROSS-REFERENCE TO RELATED APPLICATIONS

This application is a National Stage of International Application No. PCT/KR2019/010782 filed Aug. 23, 2019, which claims priority under U.S.C. § 119(a) to Korea Patent Application no. 10-2018-0170634 filed Dec. 27, 2018.

TECHNICAL FIELD

Embodiments of the present disclosure relate to a non-conductive adhesive film for semiconductor packages and a method of manufacturing a semiconductor package using the same, and more particularly, to a non-conductive adhesive film for semiconductor packages capable of substantially minimizing warpage deformation of a semiconductor package and to a method of manufacturing a semiconductor package using the same.

BACKGROUND ART

With the recent development of the semiconductor industry, processing speed, design, and high functionality of a device are increasingly demanded. In particular, in the case of mobile devices such as mobile phones and tablet PCs, miniaturization, thinness, and weight reduction are required along with high performance. In response to these demands, research on a three-dimensional (3D) laminating (e.g., stacking) method of device elements is being conducted recently. In particular, a 3D packaging technology using a through silicon via (TSV) (hereinafter, referred to as "TSV 3D packaging technology") may significantly shorten a wiring distance, and thus it has a huge advantage in terms of device acceleration, reduced power consumption, and miniaturization. In addition, significantly fine metal wirings and a large number of metal and dielectric layers may be formed, and conventional semiconductor processing equipment may be used as it is. Accordingly, the application of TSV 3D packaging technology is expected to greatly expand in the future.

The TSV 3D packaging technology may be classified, for example, into a TSV drilling and filling process to form a through silicon electrode in a wafer, a temporary bonding and debonding process to bond an ultra-thin wafer onto a carrier wafer using temporary bonding and debonding adhesives, a back-grinding process for thinning the wafer, and a process of three-dimensionally laminating and bonding the prepared ultra-thin semiconductor chip.

In the case of 3D lamination of semiconductor chips, recently, semiconductor chips are bonded using a non-conductive adhesive film. However, due to a difference in the coefficient of thermal expansion between the conventional non-conductive adhesive film and the semiconductor chip, warpage deformation may occur in the semiconductor package as the temperature or time elapses, which may lead to poor connection and reduced reliability.

SUMMARY

Embodiments of the present disclosure may be directed to a non-conductive adhesive film for semiconductor packages capable of substantially minimizing warpage deformation of semiconductor packages.

Embodiments of the present disclosure may also be directed to a method of manufacturing a semiconductor package improved, by using the above-described non-conductive adhesive film, in terms of reliability of the semiconductor package, while simplifying the process and improving production efficiency.

Technical Means

According to an embodiment, a non-conductive adhesive film for semiconductor packages includes: a base; and an adhesive layer disposed on one surface of the base and having a storage modulus in a range of 2 to 4 GPa at 25° C.

In some embodiments, the adhesive layer may have a weight reduction rate of 1% or less at 250° C. by thermogravimetric analysis (TGA).

In some embodiments, the adhesive layer may have an onset temperature in a range of 160 to 200° C.

According to an embodiment, a method of manufacturing a semiconductor package includes: (S100) sequentially and alternately laminating, on a substrate, the adhesive layer of the above-described non-conductive adhesive film, and a semiconductor device having a through silicon via (TSV) structure on at least one surface of which a connection terminal is disposed to form a multi-layered laminate; (S200) bonding connection terminals of respective semiconductor devices in the laminate to each other by thermo-compressing the laminate; and (S300) curing the adhesive layer in the thermo-compressed laminate.

Effects of the Invention

According to one or more embodiments of the present disclosure, it is possible to improve reliability of a semiconductor package by substantially minimizing warpage deformation and slip properties during packaging of the semiconductor device.

BRIEF DESCRIPTION OF THE DRAWINGS

A more complete appreciation of the present disclosure will become more apparent by describing in detail embodiments thereof with reference to the accompanying drawings, wherein.

BRIEF DESCRIPTION OF REFERENCE SIGNS 10A, 10B: Non-conductive adhesive film
11: Base
12: Adhesive layer
20: Substrate,
30: Semiconductor device substrate,
31: Semiconductor
32: Through via terminal;
33: Connection
34: Solder layer 100-1, 100-2, 100-n: Unit body;
200, 300, 400: Laminate

DETAILED DESCRIPTION

Hereinafter, the present disclosure will be described.
<Non-Conductive Adhesive Film for Semiconductor Package>

Figure 1:
FIG. 1 is a cross-sectional view schematically illustrating a non-conductive adhesive film for semiconductor packages according to an embodiment of the present invention.
Figure 2:
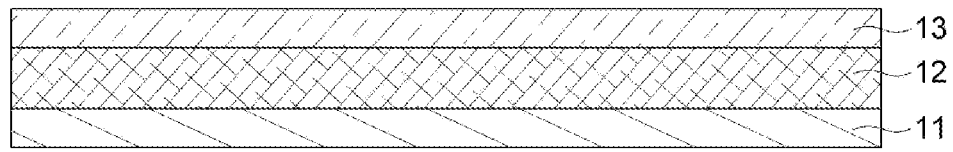
FIG. 2 is a cross-sectional view schematically illustrating a non-conductive adhesive film for semiconductor packages according to another embodiment of the present invention.

FIG. 1 is a cross-sectional view schematically illustrating a non-conductive adhesive film for semiconductor packages according to an embodiment of the present invention, and FIG. 2 is a cross-sectional view schematically illustrating a non-conductive adhesive film for semiconductor packages according to another embodiment of the present invention.

A non-conductive adhesive film 10A according to the present invention, which is an adhesive film used in semiconductor packaging, includes a base (e.g., substrate) 11 and an adhesive layer 12 disposed on one surface of the base, as illustrated in FIG. 1. Optionally, another base (hereinafter, "second base") 13 disposed on another surface of the adhesive layer may be further included (see FIG. 2).

Hereinafter, the non-conductive adhesive film 10A for semiconductor packages according to a first embodiment of the present invention will be described with reference to FIG. 1.

1) Base

In the non-conductive adhesive film according to the present invention, a base 11 is a portion for protecting a surface of the adhesive layer while supporting the adhesive layer and is delaminated and removed when the non-conductive adhesive film is in use.

As the base 11, any plastic film commonly known in the art may be used without limitation, as long as it is delaminatable, and a release paper may also be used.

Non-limiting examples of the applicable plastic films may include polyester films such as polyethylene terephthalate (PET), polybutylene terephthalate, and polyethylene naphthalate, polyethylene films, polypropylene films, cellophane, diacetylcellulose films, triacetylcellulose films, acetylcellulose butyrate film, polyvinyl chloride film, polyvinylidene chloride film, polyvinyl alcohol film, ethylene-vinyl acetate copolymer film, polystyrene film, polycarbonate film, polymethylpentene film, polysulfone film, polyether ether ketone film, polyethersulfone film, polyetherimide film, polyimide film, fluororesin film, polyamide film, acrylic resin film, norbornene-based resin film, cycloolefin resin film, and the like. Such plastic films may be transparent or translucent or may be colored or uncolored. As an example, the base 11 may be polyethylene terephthalate (PET). As another example, the base 11 may be polyimide (PI).

A release layer may be disposed on such a plastic film. When the base is separated from the adhesive layer, the release layer facilitates separation of the adhesive layer from the base while maintaining the shape of the adhesive layer without damage. In such an embodiment, the release layer may be a commonly used film-based release material.

A component of the release agent used in the release layer is not particularly limited, and any conventional release component known in the art may be used. Non-limiting examples thereof may include an epoxy-based release agent, a release agent made of a fluororesin, a silicone-based release agent, an alkyd resin-based release agent, a water-soluble polymer, and the like. In addition, if necessary, a component of the release layer may include a powder filler such as silicon, silica, and the like. In such a case, as the powder filler in the form of fine particles, two-types of powder fillers may be mixed with each other, and their average particle size may be appropriately selected in consideration of the surface roughness to be formed.

In addition, a thickness of the release layer may be appropriately adjusted within a conventional range known in the art.

In the present invention, a thickness of the base 11 is not particularly limited and may be adjusted within a conventional range known in the art, for example, in a range of about 25 to 150 μm, specifically in a range of about 30 to 100 μm, more specifically in a range of about 30 to 50 μm.

A release force of the base 11 is not particularly limited, and may be, for example, in a range of about 1 to 500 gf/inch, and specifically in a range of about 10 to 100 gf/inch.

A method of forming the release layer is not specifically limited, and any well-known methods, such as heat press, heated roll lamination, extrusion lamination, application of a coating liquid, and drying, may be applicable.

2) Adhesive Layer

In the non-conductive adhesive film according to the present invention, the adhesive layer 12, disposed on one surface of the base 11, may connect a substrate and a semiconductor device and/or semiconductor devices to each other during semiconductor packaging, and as an underfill, may redistribute stress and strain caused by a difference in thermal expansion coefficient between the semiconductor chip and the package substrate.

The adhesive layer 12 of the present invention has a storage modulus in a range of 2 to 4 GPa at 25° C. Accordingly, the non-conductive adhesive film of the present invention may not only minimize the occurrence of warpage of the semiconducting package during semiconductor packaging through three-dimensional lamination of the semiconductor devices, but also minimize the handling problem which may occur due to the slip of the semiconductor device, and accordingly, it is possible to improve the reliability of the semiconductor package.

According to an example, the adhesive layer of the present invention may be formed of an adhesive resin composition including: (a) two or more different kinds of epoxy resins, (b) a curing agent, (c) a curing accelerator, and (d) nano-silica.

In the adhesive resin composition, two or more different kinds of epoxy resins may be used without particular limitation, as long as they are generally known in the art. As used herein, the epoxy resin means a polymer containing an epoxy group.

According to an example, the two or more different kinds of epoxy resins may include a liquid epoxy resin and an epoxy group-containing phenoxy resin. In such a case, in the adhesive layer of the present invention, occurrence of voids between bumps may be reduced and bump fillability may be improved, thus securing the reliability of bump bonding, and the adhesion to the wafer or substrate may be improved to prevent delamination, and furthermore, heat resistance may be improved.

As used herein, a mixing ratio of the liquid epoxy resin and the epoxy group-containing phenoxy resin is not particularly limited. However, when the mixing ratio of the liquid epoxy resin and the epoxy group-containing phenoxy resin is 1:0.5 to 3 by weight, specifically 1:0.5 to 1.5 by weight, the adhesive layer may have a low storage modulus.

In the two or more different kinds of epoxy resins according to the present invention, the liquid epoxy resin is an epoxy resin that is in a liquid state at 25±5° C. and is a thermosetting resin. Such a first epoxy resin imparts adhesiveness and curability to the adhesive resin composition and imparts curing uniformity to the adhesive layer after curing.

Non-limiting examples of the liquid epoxy resins applicable in the present invention may include liquid bisphenol A-based epoxy resin, liquid bisphenol F-based epoxy resin, liquid naphthalene-based epoxy resin, liquid aminophenol-based epoxy resin, liquid hydrogenated bisphenol-based epoxy resin, liquid alicyclic epoxy resin, liquid alcohol ether-based epoxy resin, liquid cycloaliphatic-based epoxy resin, liquid fluorene-based epoxy resin, liquid siloxane-based epoxy resins, and the like, among which liquid bisphenol A-based epoxy resin, liquid bisphenol F-based epoxy resin, and liquid naphthalene-based epoxy resin are suitable in terms of adhesiveness, curability, durability, and heat resistance. These may be used solely or two or more thereof may be used in combination.

Specifically, liquid epoxy resin products may include a bisphenol F-based epoxy resin (product name: YDF8170) manufactured by Nippon Steel & Sumikin Chemical, a bisphenol A-based epoxy resin (product name: EXA-850CRP) manufactured by DIC, a bisphenol F-based epoxy resin (product name YDF870GS) manufactured by Nippon Steel & Sumikin Chemical, a naphthalene-based epoxy resin (product name HP4032D) manufactured by DIC, an aminophenol-based epoxy resin (grade JER630, JER630LSD) manufactured by Mitsubishi Chemical, a siloxane-based epoxy resin (product name TSL9906) manufactured by Momentive Performance Materials, and 1,4-cyclohexanedimethanol diglycidyl ether (product name ZX1658GS) manufactured by Nippon Steel & Sumikin Chemical, but embodiments are not limited thereto.

In the two or more different kinds of epoxy resins according to the present invention, the epoxy group-containing phenoxy resin is a thermoplastic polymer containing an epoxy group at at least one end (e.g., terminal), and since an equivalent weight of the epoxy group in the molecule is significantly small compared to a molecular weight, it may participate in curing but impart fluidity at high temperatures. Due to the epoxy group-containing phenoxy resin, the adhesive layer of the present invention may be molded into a semi-cured (B-stage) film shape at room temperature (about 25±5° C.).

The epoxy group-containing phenoxy resin applicable in the present invention is not particularly limited as long as it is a polymer containing an epoxy group at at least one end thereof.

For example, the phenoxy resin may be a compound represented by the following Chemical Formula 1, but embodiments are not particularly limited thereto.

[Chemical Formula 1]

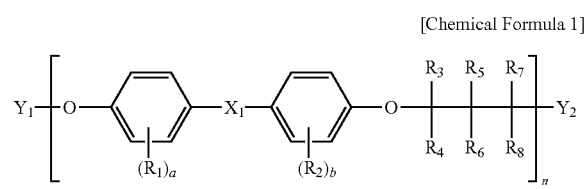

In Chemical Formula 1,
a and b are each an integer ranging from 1 to 4,
a plurality of $R_1$ and a plurality of $R_2$ are the same or different from each other, each independently being selected from the group consisting of hydrogen, halogen, a $C_1$ to $C_{10}$ alkyl group, a $C_3$ to $C_{20}$ cycloalkyl group, a $C_5$ to $C_{20}$ aryl group and a nitro group, and specifically, each independently being selected from the group consisting of hydrogen, halogen, a $C_1$ to $C_5$ alkyl group, a $C_3$ to $C_{10}$ cycloalkyl group, a $C_5$ to $C_{10}$ aryl group and a nitro group;

$R_3$ to $R_8$ are the same as or different from each other, each independently being hydrogen or a hydroxy group, provided that at least one of $R_3$ to $R_8$ is a hydroxy group;

$X_1$ is a single bond or a $C_1$ to $C_{10}$ alkylene group, and specifically, a single bond or a $C_1$ to $C_5$ alkylene group, $Y_1$ and $Y_2$ are the same as or different from each other, each independently being hydrogen, a hydroxy group or an epoxy group, provided that at least one of $Y_1$ and $Y_2$ is an epoxy group, and n is an integer ranging from 30 to 400.

The two or more different kinds of epoxy resins according to the present invention may further include an epoxy resin known in the art, preferably a polyfunctional epoxy resin, in addition to the liquid epoxy resin and the epoxy group-containing phenoxy resin.

According to an example, the two or more different kinds of epoxy resins may include a liquid epoxy resin, an epoxy group-containing phenoxy resin, and a polyfunctional epoxy resin. In such an embodiment, a mixing ratio among the liquid epoxy resin, the epoxy group-containing phenoxy resin and the polyfunctional epoxy resin is not particularly limited, for example, the mixing ratio of the liquid epoxy resin, the epoxy group-containing phenoxy resin and the polyfunctional epoxy resin may be 1:0.5 to 3:0.5 to 3 by weight, specifically 1:0.5 to 1.5:0.5 to 1.5 by weight. In such an embodiment, the adhesive layer of the present invention may have excellent adhesion and have a low storage modulus, and fume generation may be minimized.

The polyfunctional epoxy resin applicable in the present invention is an epoxy resin containing two or more epoxy groups. Such a polyfunctional epoxy resin imparts electrical insulation, heat resistance, chemical stability, toughness, and moldability to the adhesive layer.

The polyfunctional epoxy resin applicable in the present invention is not particularly limited as long as it is an epoxy resin containing two or more, specifically, two to five epoxy groups per molecule (monomer). Non-limiting examples of the polyfunctional epoxy resin may include epoxy resins obtained by epoxidizing a condensate of phenol or alkyl phenols with hydroxybenzaldehyde, phenol novolak-type epoxy resins, cresol novolak-type epoxy resins, phenol aralkyl-type epoxy resins, biphenyl-type epoxy resins, bisphenol A-type epoxy resins, bisphenol F-type epoxy resins, linear aliphatic epoxy resins, alicyclic epoxy resins, heterocyclic epoxy resins, epoxy resins containing spiro ring, xylok-type epoxy resins, polyfunctional epoxy resins, naphthol novolak-type epoxy resins, bisphenol A/bisphenol F/bisphenol AD novolak-type epoxy resins, bisphenol A/bisphenol F/bisphenol AD glycidyl ether epoxy resins, bishydroxybiphenyl-based epoxy resins, dicyclopentadiene-based epoxy resins, naphthalene-based epoxy resins, and the like. Among them, polyfunctional epoxy resins that are non-liquid at 25±5° C. are preferable. In such an embodiment, the non-liquid phase at 25±5° C. means an epoxy resin that is semi-solid or solid at 25±5° C. and also includes an epoxy resin close to the solid phase.

The adhesive resin composition includes a curing agent. The curing agent is a component for curing the two or more different kinds of epoxy resins.

The curing agent applicable in the present invention is not particularly limited as long as it is known in the art as a component for curing an epoxy resin. For example, applicable curing agent may include acid anhydride-based curing agent such as tetrahydrophthalic anhydride, methyl tetrahydrophthalic anhydride, methyl hexahydrophthalic anhydride, hexahydrophthalic anhydride, trialkyl tetrahydrophthalic anhydride, methyl cyclohexenedicarboxylic anhydride, phthalic anhydride, maleic anhydride, and pyromellitic anhydride; aromatic amine-based curing agents, such as metaphenylenediamine, diaminodiphenylmethane, diaminodiphenyl sulfone; aliphatic amine-based curing agents such as diethylenetriamine and triethylenetetraamine; phenolic curing agents such as phenol aralkyl-type phenol resins, phenol novolak-type phenol resins, xylok-type phenol resins, cresol novolak-type phenol resins, naphthol-type phenol resins, terpene-type phenol resins, polyfunctional-type phenol resins, dicyclopentadiene-type phenol resins, naphthalene-type phenol resins, novolak-type phenolic resins synthesized from bisphenol A and resol; and latent curing agents such as dicyandiamide, which may be used solely or in combination of two or more.

The adhesive resin composition includes a curing accelerator. However, in the present invention, in order secure the high-temperature stability of the adhesive layer, while controlling the curing rate, at least one selected from the group consisting of a compound represented by the following Chemical Formula 2 and a compound represented by the following Chemical Formula 3 is included as a curing accelerator.

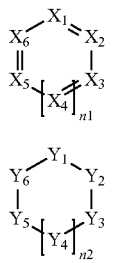

[Chemical Formula 2]

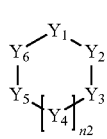

[Chemical Formula 3]

In Chemical Formulas 2 and 3,
n1 is 1 or 2,
n2 is an integer in a range of 0 to 2,
$X_1$ to $X_6$ are the same as or different from each other, each independently representing N or $C(R_1)$, provided that at least one of $X_1$ to $X_6$ is N; and
$Y_1$ to $Y_6$ are the same as or different from each other, each independently representing $N(R_2)$ or $C(R_3)(R_4)$, provided that at least one of $Y_1$ to $Y_6$ is $N(R_2)$,
where the plurality of $C(R_1)$ are the same as or different from each other, the plurality of $N(R_2)$ are the same as or different from each other, and the plurality of $C(R_3)(R_4)$ are the same or different from each other, and
$R_1$, $R_2$, $R_3$ and $R_4$ are each independently selected from the group consisting of hydrogen, deuterium (D), halogen, a cyano group, a nitro group, a $C_1$ to $C_{20}$ alkyl group, a $C_2$ to $C_{20}$ alkenyl group, and $C_2$ to $C_{20}$ alkynyl group.
Specifically, in Chemical Formula 2, one or two of $X_1$ to $X_6$ may be N, and the others may be $C(R_1)$.
In addition, in Chemical Formula 3, one or two of $Y_1$ to $Y_6$ may be $N(R_2)$, and the others may be $C(R_3)(R_4)$.

In addition, in Chemical Formulas 2 and 3, $R_1$, $R_2$, $R_3$ and $R_4$ may each independently be selected from the group consisting of: hydrogen, deuterium (D), halogen, a cyano group, a nitro group, a $C_1$ to $C_{12}$ alkyl group, a $C_2$ to $C_{12}$ alkenyl group, and a $C_2$ to $C_{12}$ alkynyl group.

Examples of the curing accelerator represented by Chemical Formula 2 may include, but are not limited to, a compound represented by Chemical Formula 2a and a compound represented by Chemical Formula 2b, but embodiments are not limited thereto.

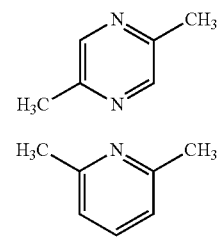

[Chemical Formula 2a]

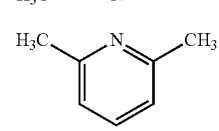

[Chemical Formula 2b]

Examples of the compound represented by Chemical Formula 3 may include a compound represented by the following Chemical Formula 3a below, but embodiments are not limited thereto.

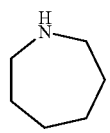

[Chemical Formula 3a]

As an example, the curing accelerator may include at least one selected from the group consisting of the compound of Chemical Formula 2a, the compound of Chemical Formula 2b, and the compound of Chemical Formula 3a.

In the adhesive resin composition of the present invention, a content of the curing accelerator is preferably adjusted in consideration of a content of the two or more different kinds of epoxy resins, or the kind and content of the curing agent. According to an example, in the adhesive resin composition of the present invention, the content of the two or more different kinds of epoxy resins may be in a range of about 40 to 80 percentage by weight (wt %) with respect to the total amount of the resin composition, a content of the curing agent may be in a range of about 5 to wt % with respect to the total amount of the resin composition, and a content of the curing accelerator may be in a range of about 0.01 to 1 wt % with respect to the total amount of the resin composition. In such an embodiment, the adhesive layer of the present invention may have a low storage modulus at room temperature, may be easy to handle, may have excellent adhesion, may minimize foaming voids, and may not cause poor connectivity.

The adhesive resin composition includes nano-silica. Nano-silica may control viscosity and workability, improve adhesion, and lower the coefficient of thermal expansion (CTE). For this reason, warpage characteristics and crack resistance may be improved when the non-conductive adhesive film according to the present invention is used during semiconductor packaging.

A shape of the nano-silica is not particularly limited, and may be, for example, angular, spherical, or the like.

In addition, an average particle diameter of the nano-silica is not particularly limited, and may be, for example, in a range of 10 to 100 nm. If the average particle diameter of the nano-silica is within the aforementioned range, mechanical properties of the cured product may be further improved.

In the adhesive resin composition of the present invention, a content of nano-silica is not particularly limited, and for example, may be the remaining amount adjusted so that the total amount of the adhesive resin composition is 100 wt %, and specifically, in a range of about 10 to 50 wt % with respect to the total amount of the adhesive resin composition. If the content of nano-silica is within the above range, an adhesive layer having a low coefficient of thermal expansion (CTE) may be formed, and thus a difference in coefficient of thermal expansion between the substrate and the semiconductor device may be small, thereby capable of minimizing the occurrence of warpage or cracks.

The adhesive resin composition of the present invention may optionally further include additives commonly known in the art in addition to the above-described components, as needed according to the purpose and environment of use of the composition. For example, solvents such as acetone, methyl ethyl ketone, toluene, and ethyl acetate, adhesion promoters, coupling agents, antistatic agents, contact property enhancers, wettability improvers, leveling enhancers, and the like may be included, but embodiments are not limited thereto.

A content of the additives is not particularly limited and may be used in a conventional range known in the art. For example, it may be included in a range of about 0.01 to wt % with respect to the total amount of the resin composition.

The above-described adhesive resin composition may be prepared through a method commonly known in the art. For example, two or more different kinds of epoxy resins (e.g., at least one selected from the group consisting of liquid epoxy resins, phenoxy resins and polyfunctional epoxy resins), curing agents, curing accelerators, nano-silica, and optional additives may be mixed and stirred at room temperature or appropriately elevated temperature using mixing equipment such as ball mill, bead mill, 3roll mill, basket mill, dyno mill, planetary, and the like, and thus the adhesive resin composition may be prepared.

A thickness of the adhesive layer according to the present invention is not particularly limited, and may be, for example, in a range of about 1 to 100 μm, and specifically, in a range of about 5 to 50 μm. However, when the adhesive layer has a thickness within the above-described range, film forming properties, thickness uniformity and the like of the film may be improved.

The adhesive layer according to the present invention may have an onset temperature in a range of about 160 to 200° C. As described above, since the adhesive layer of the present invention has a high onset temperature, it is possible to exhibit stable curing properties at high temperatures.

In addition, the adhesive layer of the present invention may have a weight reduction rate of 1% or less at 250° C. by thermogravimetric analysis (TGA). As such, the adhesive layer of the present invention has excellent high-temperature stability. For this reason, generation of fume from the non-conductive adhesive film of the present invention may be minimized, and accordingly, the non-conductive adhesive film of the present invention may package semiconductor devices in an environmentally friendly and economical manner.

The non-conductive adhesive film according to the present invention may be manufactured by a method generally known in the art. For example, the non-conductive adhesive film may be manufactured by: diluting the adhesive resin composition obtained through the above-described method with an organic solvent for dilution as needed to mix them to an appropriate concentration to facilitate preparation of a coating film, and then coating it to a base and drying.

The coating and drying method is not particularly limited as long as it is a method capable of forming a coating film, such as bar coating, gravure coating, comma roll coating, roll reverse coating, roll knife coating, die coating, or lip coating.

Since the above-described non-conductive adhesive film of the present invention has a low storage modulus and a low coefficient of thermal expansion (CTE), it has excellent reliability in terms of, for example, warpage deformation of a semiconductor package and has excellent high temperature stability, and accordingly, it may be packaged at a high temperature and has excellent processability. In addition, the non-conductive adhesive film of the present invention may be improved in terms of bump filling properties, thereby securing bump bonding reliability, may also be improved in terms of adhesion to a wafer or substrate to prevent delamination, and may further be improved in terms of heat resistance.

Hereinafter, a non-conductive adhesive film 10B according to a second embodiment of the present invention illustrated in FIG. 2 will be described.

As illustrated in FIG. 2, the non-conductive adhesive film 10B of the present invention includes a base (hereinafter, "first base") 11; an adhesive layer 12 disposed on one surface of the base; and another base (hereinafter, "second base") 13 disposed on another surface of the adhesive layer 12.

In the non-conductive adhesive film 10B according to the second embodiment, elements other than the second base, that is, the first base 11 and the adhesive layer 12, are the same as those described in the first embodiment, respectively, and thus descriptions thereof will be omitted.

In the present invention, the second base 13 is a portion disposed on another surface of the adhesive layer 13 to protect a surface thereof, while supporting the adhesive layer, and is delaminatable to be delaminated and removed when the non-conductive adhesive film is in use.

The second base 13 is substantially the same as or different from the first base, and detailed descriptions thereof are the same as those described with respect to the first base, and thus will be omitted.

<Method of Manufacturing Semiconductor Package>

In an embodiment, the present invention may provide various methods of manufacturing semiconductor packages using the above-described non-conductive adhesive films 10A and 10B. In particular, since the non-conductive adhesive film has a low storage modulus at room temperature, it is possible to improve reliability by substantially minimizing the warpage problem of the semiconductor package. Accordingly, according to the present invention, the degree of integration of a semiconductor package may be improved by three-dimensionally laminating semiconductor devices using the non-conductive adhesive film.

As an example, a method of manufacturing a semiconductor package includes: (S100) sequentially and alternately laminating, on a substrate, the adhesive layer of the aforementioned non-conductive adhesive film and a semiconductor device having a TSV structure on at least one surface of which a connection terminal is disposed to form a multi-layered laminate; (S200) bonding connection terminals of respective semiconductor devices in the laminate to each other by thermo-compressing the laminate; and (S300) curing the adhesive layer in the thermo-compressed laminate. However, in the above-described manufacturing method according to the present invention, the steps of each process may be modified or selectively mixed as needed.

Hereinafter, a method of manufacturing a semiconductor package according to the present invention will be described for each process step with reference to FIGS. 3 to 6.

(S100) Formation of a Laminate

On a substrate, the adhesive layer of the above-described non-conductive adhesive film and the semiconductor device are sequentially and alternately laminated to form a multi-layered laminate.

Figure 3:
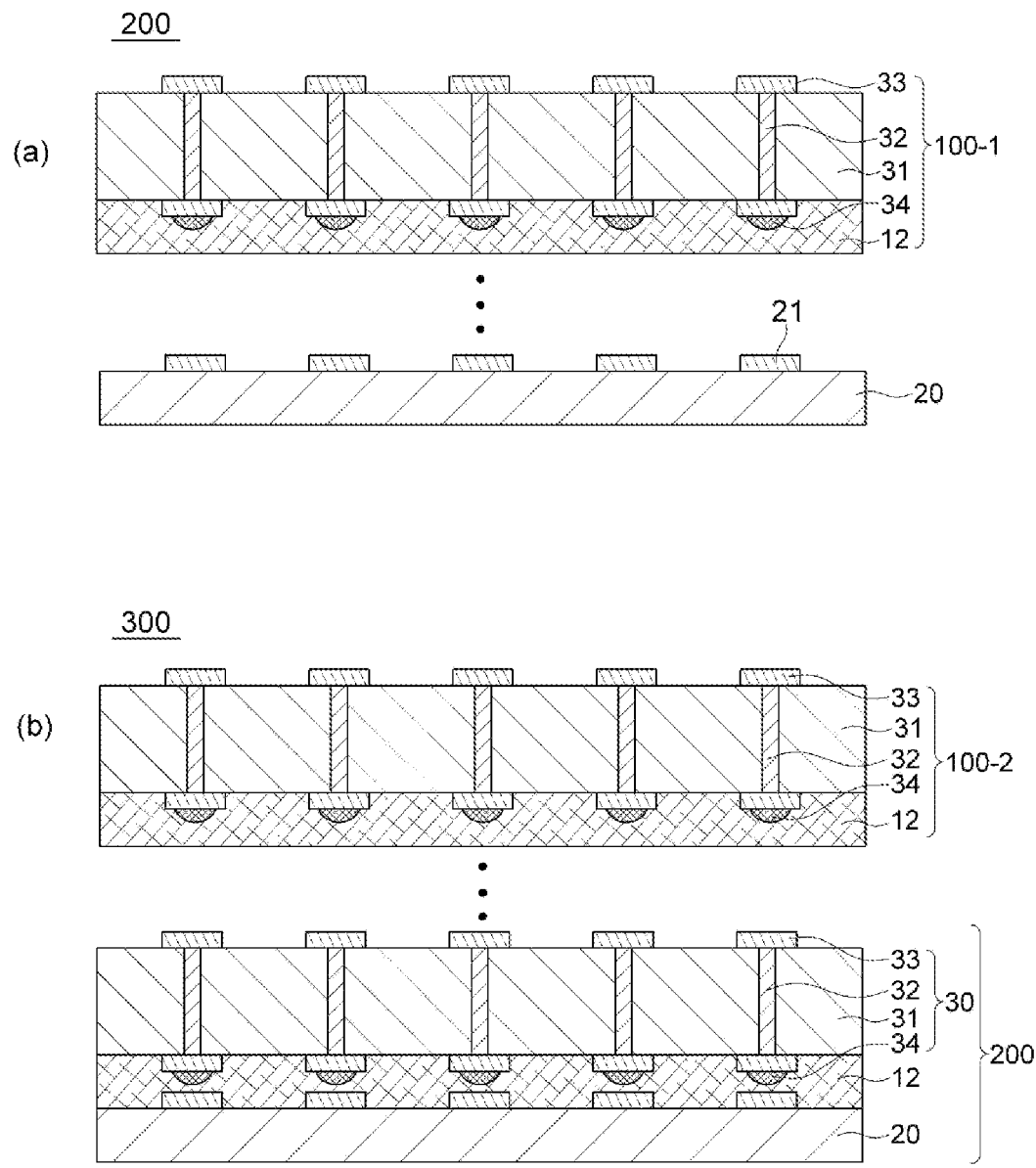
FIGS. 3 to 6 are cross-sectional views schematically illustrating a process of manufacturing a semiconductor package according to an embodiment of the present invention.
Figure 4:
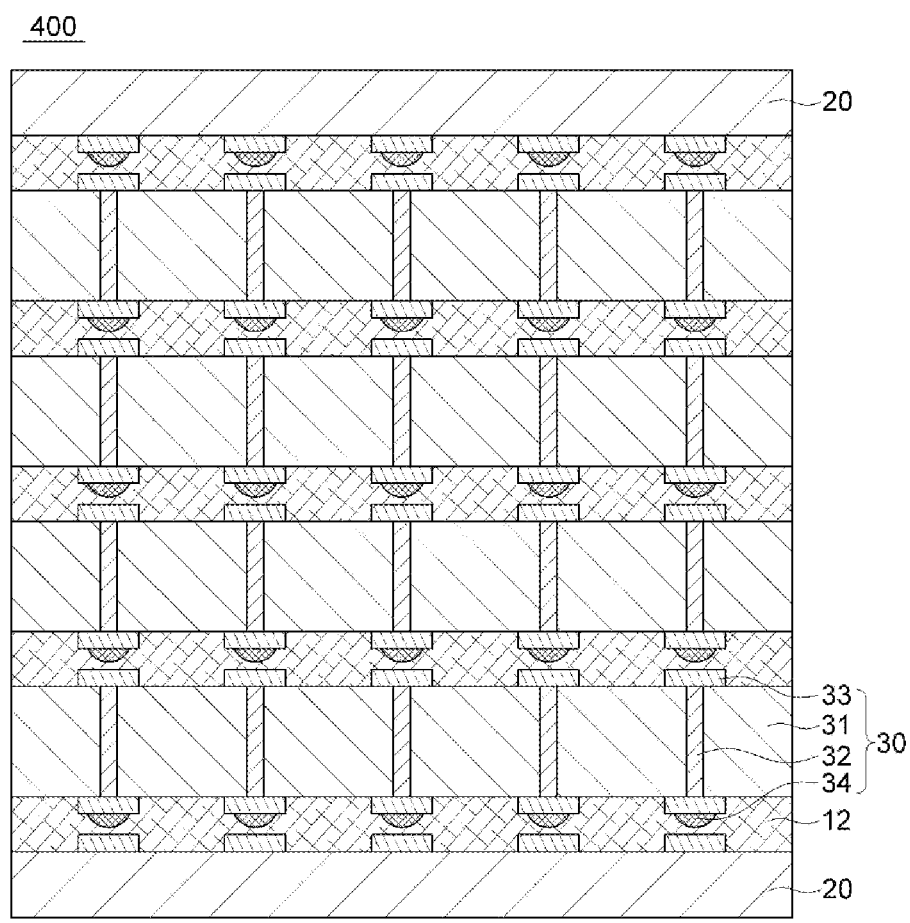

For example, in step S100, as illustrated in FIG. 3(*a*), a first unit body 100-1 prepared by disposing an adhesive layer 12 of non-conductive adhesive films 10A, 10B on one surface of a semiconductor device 30 is laminated on one surface of a substrate 20, and accordingly, a first laminate 200 is formed. In such a case, the adhesive layer 12 is laminated so as to contact the substrate 20. Then, as illustrated in FIG. 3(*b*), a second unit body 100-2 is laminated on the semiconductor device 30 of the first laminate 200 such that the adhesive layer 12 contacts the semiconductor device 30 of the first unit body 100-1, and accordingly, a second laminate 300 is formed. Then, as illustrated in FIG. 4, a third unit body 100-3 to an n-th unit body 100-*n* are sequentially laminated on the second laminate 300 to form a multi-layered laminate 400 (herein, n may be a natural number of 3 or more, specifically 3 to 10). In such a case, the semiconductor devices in respective unit bodies may be the same or different from each other.

According to another example, although not illustrated, step S100 may be repeatedly performed in such a way that the adhesive layer of the non-conductive adhesive film is disposed on one surface of the substrate, and then the semiconductor device is disposed on another surface of the adhesive layer, and accordingly, a multi-layered laminate in which the adhesive layer of the non-conductive adhesive film and the semiconductor device are sequentially and alternately laminated may be formed.

The substrate 20 applicable in the present invention may be a substrate having a circuit pattern 21 formed on one surface thereof, for example, a printed circuit board (PCB), various lead frames, and a substrate on which electronic components such as resistors and capacitors are mounted on the surface of the substrate.

The semiconductor device 30 applicable in the present invention may be a memory chip such as DRAM or SRAM, a logic chip, a MEMS chip, or a high bandwidth memory (HBM) DRAM chip. The semiconductor device 30 has a through silicon via (TSV) structure and includes, for example, a semiconductor substrate 31, a plurality of through silicon vias (TSV) (e.g., through silicon electrodes) 32 formed in the semiconductor substrate, a plurality connection terminals 33 disposed on at least one of the plurality of through vias, and a solder layer (e.g., solder ball) 34 disposed on the connection terminal (see FIG. 3).

Examples of the semiconductor substrate 31 may be a silicon substrate, a SiC substrate, a GaS substrate, or the like.

The through via (e.g., through electrode) 32 is an electrode that fills a hole defined through the semiconductor substrate in a vertical direction with a conductive material such as carbon or metal, e.g., copper (Cu), silver (Ag), nickel (Ni), or the like to connect upper and lower portions of the substrate in a direct, electrical manner. The through vias 32 may be provided in plural, some of which are exposed to the outside. The connection terminal 33 is disposed on at least a portion of the plurality of exposed through vias 32.

The connection terminal 33 may be a bump, a conductive spacer, a pin grid array (PGA), a lead grid array, or a combination thereof. According to an example, the connection terminal may be a bump disposed on the through via. The solder layer 34 is disposed on the connection terminal 33, such that when the laminate is thermally compressed, the semiconductor devices are electrically connected by solder bonding.

In this step, the semiconductor device may be laminated on the adhesive layer by pressing at a pressure of about 20 to 100 N. In addition, if necessary, the semiconductor device may be laminated under pressure at a temperature lower than the onset temperature of the adhesive layer, for example, at a temperature in a range of 50 to 100° C. In such a case, the adhesive layer in a semi-cured state (B-stage) bonds the substrate and the semiconductor device and/or the semiconductor devices to each other.

(S200) Thermo-Compressing of the Laminate

The multi-layered laminate 400 obtained in the step S100 is thermo-compressed. Accordingly, the connection terminals of respective semiconductor devices in the thermally compressed stack 500 are bonded to each other.

Figure 5:
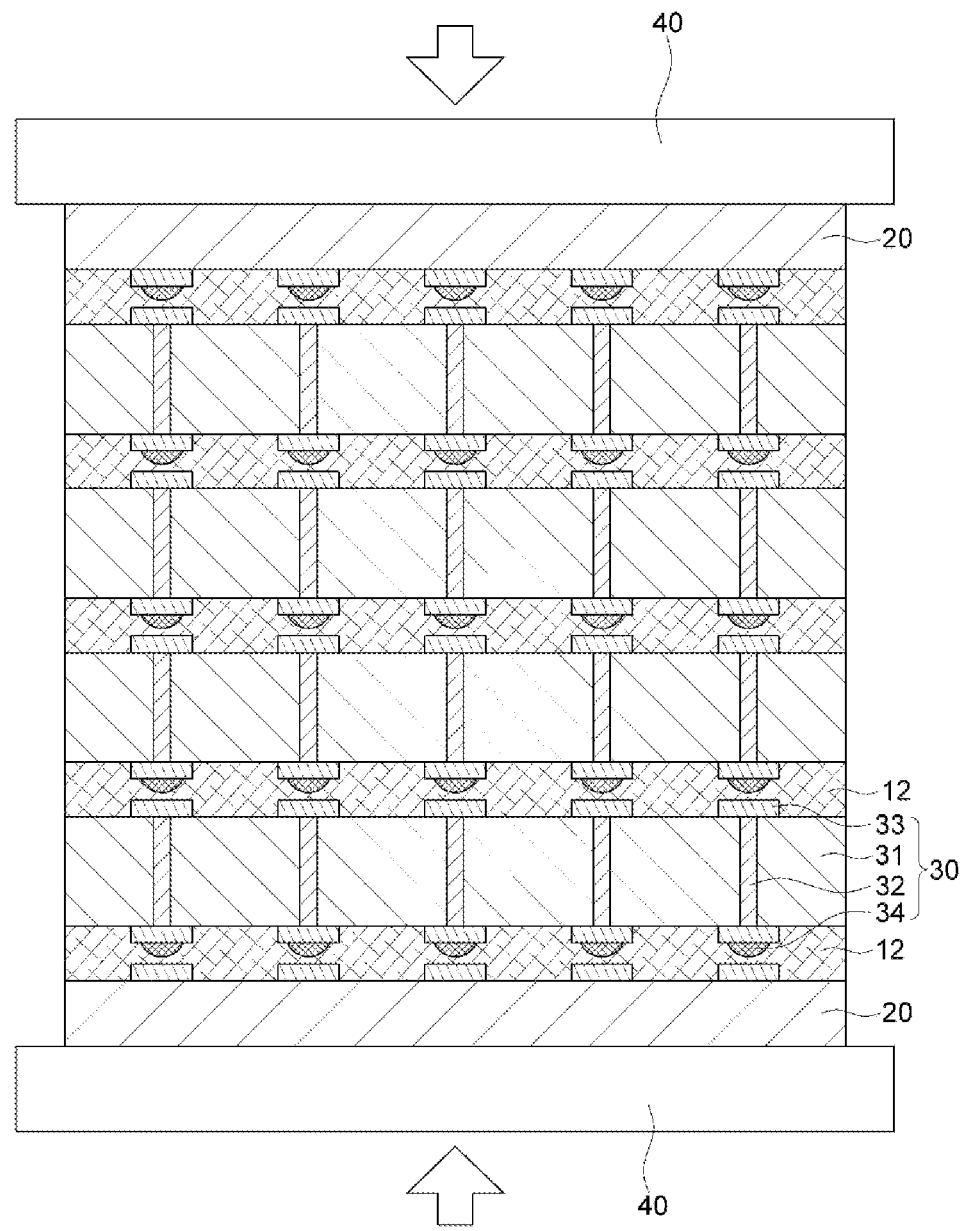
Figure 6:
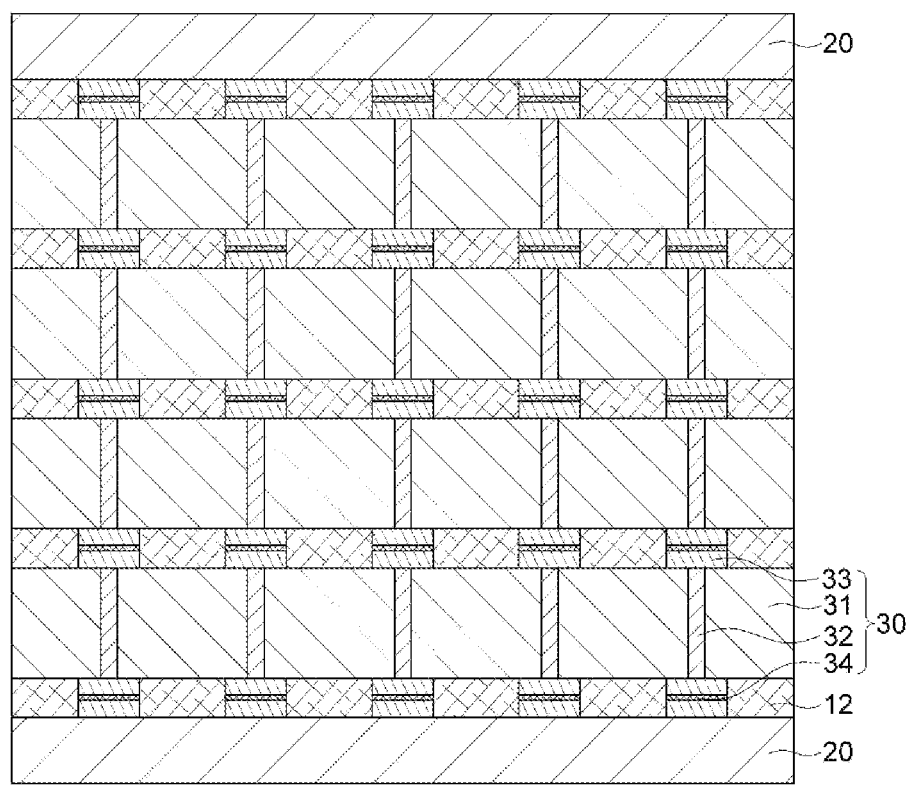

This step is carried out at a temperature in a range of about 200 to 300° C. and a pressure in a range of about 50 to 200 N. For example, as illustrated in FIG. 5, the upper and lower portions of the laminate are thermo-compressed using a device capable of thermal compressing. In such a case, the connection terminals in the laminate may be solder-bonded by melting the solder layer, thereby being electrically connected to each other.

(S300) Curing of the Adhesive Layer

The adhesive layer 12 in the laminate 500 thermo-compressed in step S200 is cured.

Since the adhesive layer has an onset temperature in a range of about 160° C. to 200° C., this step may be performed at a temperature higher than the onset temperature, for example, in a range of about 160 to 200° C., preferably at a temperature in a range of about 170 to 200° C.

A curing time of the adhesive layer is controlled according to the curing temperature, and may be, for example, in a range of about 1 to 3 hours.

Hereinafter, the present invention will be described in detail through Embodiments, but the following Embodiments and Experimental Examples are merely illustrative of one aspect of the present invention, and the scope of the present invention is not limited by the Embodiments and Experimental Examples below.

Embodiments 1 to 3 and Comparative Example 1:
Preparation of Non-Conductive Adhesive Film 1-1. Preparation of Adhesive Resin Composition Adhesive resin compositions of Embodiments 1 to 3 and Comparative Example 1 were prepared by mixing each component according to the composition illustrated in Table 1 below. A content unit of each component described in Table 1 is in percentage by weight (wt %) with respect to the total amount of the resin composition.

1-2. Preparation of Non-Conductive Adhesive Film

On one surface of a PET release film (thickness: 50 μm), each of the adhesive resin compositions prepared in Example 1-1 was die coated, and then dried to form adhesive layers (thickness: 20 μm), and accordingly, non-conductive adhesive films were prepared.

TABLE 1

| Adhesive resin composition | | Embodiment 1 | Embodiment 2 | Embodiment 3 | Embodiment 4 | Comp. example 1 |
|---|---|---|---|---|---|---|
| Two or more kinds of epoxy resins | YD-128 | 30 | 30 | 30 | 30 | 30 |
| | YP-50 | 25 | 25 | 25 | 25.08 | 25 |
| Curing agent | MHHPA | 14.8 | 14.8 | 14.8 | 14.9 | 14.8 |
| Curing accelerator | 2,5-dimethylpyrazine | 0.2 | — | — | 0.02 | — |
| | 2,6-lutidine | — | 0.2 | — | — | — |
| | hexamethyleneimine | — | — | 0.2 | — | — |
| | 2E4MZA | — | — | — | — | 0.2 |
| Nano-silica | 10~100 nm | 30 | 30 | 30 | 30 | 30 |

* YD-128: KUKDO Chemical co., Ltd.
* YP-50: KUKDO Chemical co., Ltd.
* MHHPA: Methylhexahydrophthalic anhydride Experimental Example 1: Evaluation of Physical Properties The physical properties of the non-conductive adhesive films prepared in Embodiments 1 to 3 and Comparative Example 1 were respectively measured as follows, and the results are shown in Table 2 below.

1) Onset Temperature

An onset temperature of the non-conductive adhesive film was measured using a Differential Scanning calorimetry (DSC).

2) Volatile Contents

A weight reduction rate of the non-conductive adhesive film was measured using a thermogravimetric analyzer while increasing the temperature from 30° C. to 800° C. at a rate of 10° C. per minute.

3) Storage Modulus

A storage modulus of the non-conductive adhesive film was measured using a dynamic mechanical analysis (DMA), while increasing the temperature from 80° C. to 270° C. at a rate of 10° C. per minute.

TABLE 2

| | Embodiment 1 | Embodiment 2 | Embodiment 3 | Embodiment 4 | Comp. example 1 |
|---|---|---|---|---|---|
| Onset temp. (° C.) | 171 | 165 | 166 | 193 | 140 |
| Volatile contents (%) | 0.9 | 1.0 | 0.9 | 1.0 | 1.4 |
| Storage modulus (GPa) | 2.8 | 3.3 | 3.1 | 2.9 | 4.1 |

What is claimed is:

1. A non-conductive adhesive film for semiconductor packages, comprising:
   a base; and
   an adhesive layer disposed on one surface of the base and having a storage modulus in a range of 2 to 4 GPa at 25° C.,
   wherein the adhesive layer is formed of an adhesive resin composition comprising:
   (a) epoxy resins comprising a liquid epoxy resin, an epoxy group-containing phenoxy resin represented by the following Chemical Formula 1, and a non-liquid polyfunctional epoxy resin, in a weight ratio of 1:0.5 to 3:0.5 to 3;
   (b) a curing agent;
   (c) one or more curing accelerator selected from the group consisting of a compound represented by the following Chemical Formula 2 and a compound represented by the following Chemical Formula 3; and
   (d) nano-silica:

[Chemical Formula 1]

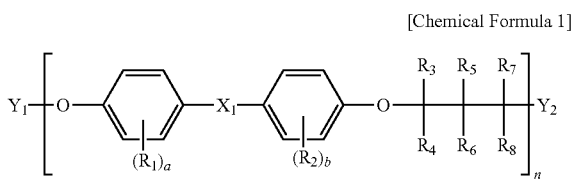

in Chemical Formula 1,
a and b are each an integer ranging from 1 to 4,
a plurality of $R_1$ and a plurality of $R_2$ are the same or different from each other, each independently being selected from the group consisting of hydrogen, halogen, a $C_1$ to $C_{10}$ alkyl group, a $C_3$ to $C_{20}$ cycloalkyl group, a $C_5$ to $C_{20}$ aryl group and a nitro group;
$R_3$ to $R_8$ are the same as or different from each other, each independently being hydrogen or a hydroxy group, provided that at least one of $R_3$ to $R_8$ is a hydroxy group;
$X_1$ is a single bond or a $C_1$ to $C_{10}$ alkylene group;
$Y_1$ and $Y_2$ are the same as or different from each other, each independently being hydrogen, a hydroxy group or an epoxy group, provided that at least one of $Y_1$ and $Y_2$ is an epoxy group, and
n is an integer ranging from 30 to 400;

[Chemical Formula 2]

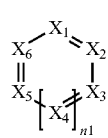

[Chemical Formula 3]

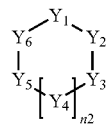

in Chemical Formulas 2 and 3,
n1 is 1 or 2,
n2 is an integer in a range of 0 to 2,
$X_1$ to $X_6$ are the same as or different from each other, each independently representing N or $C(R_1)$, provided that two of $X_1$ to $X_6$ are N; and
$Y_1$ to $Y_6$ are the same as or different from each other, each independently representing $N(R_2)$ or $C(R_3)(R_4)$, provided that two of $Y_1$ to $Y_6$ are $N(R_2)$,
where a plurality of $C(R_1)$ are the same as or different from each other, a plurality of $N(R_2)$ are the same as or different from each other, and a plurality of $C(R_3)(R_4)$ are the same as or different from each other, and
$R_1$, $R_2$, $R_3$ and $R_4$ are each independently selected from the group consisting of hydrogen, deuterium (D), halogen, a cyano group, a nitro group, a $C_1$ to $C_{20}$ alkyl group, a $C_2$ to $C_{20}$ alkenyl group, and a $C_2$ to $C_{20}$ alkynyl group.

2. The non-conductive adhesive film for semiconductor packages of claim 1, wherein the adhesive layer has a weight reduction rate of 1% or less at 250° C. by thermogravimetric analysis (TGA).

3. The non-conductive adhesive film for semiconductor packages of claim 1, wherein the adhesive layer has an onset temperature in a range of 160 to 200° C.

4. The non-conductive adhesive film for semiconductor packages of claim 1, wherein the adhesive resin composition comprises: with respect to a total amount of the adhesive resin composition,
the epoxy resins in a range of 40 to 80 percentage by weight (wt %);
the curing agent in a range of 5 to 20 wt %;
the one or more curing accelerator in a range of 0.01 to 1 wt %; and
the nano-silica of a residual amount.

5. The non-conductive adhesive film for semiconductor packages of claim 1, wherein the curing agent comprises at least one selected from the group consisting of an alicyclic acid anhydride, an aromatic amine-based curing agent, an aliphatic amine-based curing agent, a phenolic curing agent, and a latent curing agent.

6. The non-conductive adhesive film for semiconductor packages of claim 1, wherein an average particle diameter of the nano-silica is in a range of 10 to 100 nm.

7. The non-conductive adhesive film for semiconductor packages of claim 1, wherein the plurality of $R_1$ and the plurality of $R_2$ are each independently selected from the group consisting hydrogen, halogen, a $C_1$ to $C_5$ alkyl group, a $C_3$ to $C_{10}$ cycloalkyl group, a $C_5$ to $C_{10}$ aryl group and a nitro group.

8. The non-conductive adhesive film for semiconductor packages of claim 1, wherein $X_1$ is a single bond or a $C_1$ to $C_5$ alkylene group.

9. A method of manufacturing a semiconductor package, comprising:
   (S100) sequentially and alternately laminating, on a substrate, the adhesive layer of the non-conductive adhesive film of claim 1, and a semiconductor device having a through silicon via (TSV) structure on at least one surface of which a connection terminal is disposed to form a multi-layered laminate;
   (S200) bonding connection terminals of respective semiconductor devices in the laminate to each other by thermo-compressing the laminate; and
   (S300) curing the adhesive layers in the thermo-compressed laminate.

10. The method of claim 9, wherein in S100, the semiconductor device is pressed and laminated on the adhesive layer at a pressure in a range of 20 to 100 N.

11. The method of claim 10, wherein the semiconductor device is laminated under pressure at a temperature in a range of 50 to 100° C.

12. The method of claim 9, wherein S200 is performed at a temperature in a range of 200 to 300° C. and a pressure in a range of 50 to 200 N.

13. The method of claim 9, wherein in S300, the adhesive layers are cured at a temperature in a range of 150 to 200° C.

14. The method of claim 9, wherein the adhesive layer has a weight reduction rate of 1% or less at 250° C. by thermogravimetric analysis (TGA).

15. The method of claim 9, wherein the adhesive layer has an onset temperature in a range of 160 to 200° C.

16. The method of claim 9, wherein the adhesive resin composition comprises: with respect to a total amount of the adhesive resin composition,
- an epoxy resins in a range of 40 to 80 percentage by weight (wt %);
- the curing agent in a range of 5 to 20 wt %;
- the one or more curing accelerator in a range of 0.01 to 1 wt %; and
- the nano-silica of a residual amount.

17. The method of claim 9, wherein the curing agent comprises at least one selected from the group consisting of an alicyclic acid anhydride, an aromatic amine-based curing agent, an aliphatic amine-based curing agent, a phenolic curing agent, and a latent curing agent.

18. The method of claim 9, wherein an average particle diameter of the nano-silica is in a range of 10 to 100 nm.

\* \* \* \* \*